US012701916B2

(12) United States Patent
Kangas

(10) Patent No.: US 12,701,916 B2
(45) Date of Patent: Aug. 4, 2026

(54) THERMOELECTRIC COOLING MODULES

(71) Applicant: Apple Inc., Cupertino, CA (US)

(72) Inventor: Miikka M. Kangas, Campbell, CA (US)

(73) Assignee: APPLE INC., Cupertino, CA (US)

( * ) Notice: Subject to any disclaimer, the term of this patent is extended or adjusted under 35 U.S.C. 154(b) by 620 days.

(21) Appl. No.: 18/084,360

(22) Filed: Dec. 19, 2022

(65) Prior Publication Data

US 2023/0403935 A1 Dec. 14, 2023

Related U.S. Application Data

(60) Provisional application No. 63/344,424, filed on May 20, 2022.

(51) Int. Cl.
| | |
|---|---|
| *H10N 10/17* | (2023.01) |
| *F25B 21/02* | (2006.01) |
| *H10N 10/81* | (2023.01) |
| *H10N 10/82* | (2023.01) |
| *H10N 10/85* | (2023.01) |

(52) U.S. Cl.
CPC ............. *H10N 10/17* (2023.02); *F25B 21/02* (2013.01); *H10N 10/81* (2023.02); *H10N 10/82* (2023.02); *F25B 2321/023* (2013.01); *H10N 10/85* (2023.02)

(58) Field of Classification Search
CPC ... B81B 7/0083–0096; G06F 1/20–206; H10F 77/60; H10F 77/63–68; H02S 40/42–425; G02F 1/133382–133385; H01L 23/42–4338; B23K 3/085; H10N 10/17; H10N 10/00; H10N 10/01; H10N 10/10; H10N 10/13; H10N 15/00; H10N 15/10; H10N 15/15; F25B 21/02; F25B 2321/023
See application file for complete search history.

(56) References Cited

U.S. PATENT DOCUMENTS

| | | | | | |
|---|---|---|---|---|---|
| 3,088,989 | A | * | 5/1963 | Lipkis | H10N 10/00 136/206 |
| 3,400,452 | A | * | 9/1968 | Emley | H10N 10/17 136/203 |
| 3,615,870 | A | * | 10/1971 | Crouthamel | H10N 10/01 174/262 |

(Continued)

FOREIGN PATENT DOCUMENTS

| | | | | |
|---|---|---|---|---|
| WO | WO-2007063755 A1 | * | 6/2007 | C22C 30/00 |
| WO | WO-2020130282 A1 | * | 6/2020 | H10N 10/17 |

(Continued)

*Primary Examiner* — Maliheh Malek
(74) *Attorney, Agent, or Firm* — Brownstein Hyatt Farber Schreck, LLP

(57) ABSTRACT

Various embodiments disclosed herein describe thermoelectric cooling modules. The thermoelectric cooling modules may include a first substrate positioned over a second substrate in a vertical stacking direction, and may include a thermoelectric connector that thermally connects the first and second substrates. The thermoelectric connector may be configured to transfer heat laterally relative to the vertical stacking direction to provide more efficient heat transfer between the first substrate and the second substrate.

14 Claims, 5 Drawing Sheets

(56) References Cited

U.S. PATENT DOCUMENTS

| | | | | |
|---|---|---|---|---|
| 3,930,303 A * | 1/1976 | Alais | H10N 10/817 | 438/455 |
| 4,049,469 A * | 9/1977 | Kolomoets | H10N 10/13 | 136/225 |
| 4,197,738 A * | 4/1980 | Degenne | G01J 5/12 | 374/30 |
| 4,251,290 A * | 2/1981 | Gomez | H10N 10/00 | 136/212 |
| 4,251,291 A * | 2/1981 | Gomez | H10N 10/00 | 126/618 |
| 4,567,365 A * | 1/1986 | Degenne | G01K 17/00 | 374/E7.004 |
| 4,938,244 A * | 7/1990 | Kumada | H10N 10/817 | 136/212 |
| 5,462,608 A * | 10/1995 | Gschwind | H10N 10/817 | 136/203 |
| 5,966,939 A * | 10/1999 | Tauchi | F25B 21/02 | 62/3.2 |
| 6,043,426 A * | 3/2000 | DePoy | H10F 77/311 | 136/253 |
| 6,288,321 B1 * | 9/2001 | Fleurial | H10N 10/852 | 136/238 |
| 6,505,468 B2 * | 1/2003 | Venkatasubramanian | F25B 21/02 | 62/331 |
| 6,672,076 B2 * | 1/2004 | Bell | F25B 21/02 | 136/200 |
| 6,800,933 B1 * | 10/2004 | Mathews | H10N 10/01 | 257/470 |
| 7,034,394 B2 * | 4/2006 | Ramanathan | H10N 10/17 | 257/E23.079 |
| 7,164,077 B2 * | 1/2007 | Venkatasubramanian | B01L 7/54 | 257/108 |
| 7,235,735 B2 * | 6/2007 | Venkatasubramanian | B82Y 10/00 | 136/203 |
| 7,523,617 B2 * | 4/2009 | Venkatasubramanian | F25B 21/02 | 62/3.2 |
| 7,638,705 B2 * | 12/2009 | Venkatasubramanian | H10N 10/00 | 136/205 |
| 8,525,016 B2 * | 9/2013 | Deane | H10N 10/17 | 136/201 |
| 8,664,509 B2 * | 3/2014 | Liu | H10N 10/17 | 136/238 |
| 9,360,382 B2 * | 6/2016 | Camberlein | G01K 17/006 | |
| 9,412,928 B2 * | 8/2016 | Donley | H10N 10/17 | |
| 9,466,778 B2 * | 10/2016 | Salzgeber | H10N 10/13 | |
| 10,964,873 B1 * | 3/2021 | Bishop | H10N 10/17 | |
| 11,362,252 B2 * | 6/2022 | Vashaee | H10N 10/13 | |
| 11,502,236 B1 * | 11/2022 | Bishop | H10N 10/853 | |
| 11,997,836 B1 * | 5/2024 | Thirumalai Ananthan Pillai | H02J 50/005 | |
| 12,102,008 B2 * | 9/2024 | Lee | H10N 10/817 | |
| 12,368,086 B2 * | 7/2025 | Chiu | H10N 10/82 | |
| 12,374,598 B2 * | 7/2025 | Fujinaga | H10F 39/80 | |
| 12,481,196 B2 * | 11/2025 | Jain | G02F 1/025 | |
| 12,557,551 B2 * | 2/2026 | Kim | H10N 10/13 | |
| 2001/0000577 A1 * | 5/2001 | Parise | H10F 77/63 | 136/201 |
| 2001/0052234 A1 * | 12/2001 | Venkatasubramanian | H10N 10/852 | 62/3.2 |
| 2002/0046762 A1 * | 4/2002 | Rossi | H10N 10/853 | 136/238 |
| 2003/0209014 A1 * | 11/2003 | Chang | F25B 21/04 | 62/3.3 |
| 2004/0177876 A1 * | 9/2004 | Hightower | H10N 10/857 | 136/211 |
| 2006/0012033 A1 * | 1/2006 | Noguchi | H10W 74/129 | 438/126 |
| 2006/0048809 A1 * | 3/2006 | Onvural | H10N 10/17 | 136/212 |
| 2006/0086118 A1 * | 4/2006 | Venkatasubramanian | F25B 21/02 | 62/259.2 |
| 2006/0128059 A1 * | 6/2006 | Ahn | G02B 6/4214 | 257/E21.705 |
| 2006/0243315 A1 * | 11/2006 | Chrysler | H10W 40/28 | 136/201 |
| 2006/0289050 A1 * | 12/2006 | Alley | H10N 10/17 | 136/203 |
| 2006/0289052 A1 * | 12/2006 | O'Quinn | H10N 10/01 | 136/201 |
| 2007/0089773 A1 * | 4/2007 | Koester | H10N 10/01 | 136/201 |
| 2009/0000652 A1 * | 1/2009 | von Windheim | H10N 10/13 | 136/230 |
| 2009/0072385 A1 * | 3/2009 | Alley | H10W 40/28 | 257/713 |
| 2009/0179323 A1 * | 7/2009 | Feng | H10W 40/228 | 438/122 |
| 2010/0163090 A1 * | 7/2010 | Liu | H10W 40/28 | 136/224 |
| 2010/0219525 A1 * | 9/2010 | Ibaraki | H10W 70/698 | 257/693 |
| 2010/0252087 A1 * | 10/2010 | Deane | H10N 10/817 | 136/200 |
| 2013/0008479 A1 * | 1/2013 | Chen | H10N 10/17 | 136/205 |
| 2015/0194589 A1 * | 7/2015 | Roh | H10N 10/17 | 136/205 |
| 2017/0284708 A1 * | 10/2017 | Wang | F25B 21/04 | |
| 2017/0288117 A1 * | 10/2017 | Song | H10N 10/01 | |
| 2017/0370776 A1 * | 12/2017 | Kangas | G01J 5/0225 | |
| 2020/0105993 A1 * | 4/2020 | Kim | F01N 5/025 | |
| 2022/0231213 A1 * | 7/2022 | Kim | H10N 10/13 | |
| 2022/0320405 A1 * | 10/2022 | Park | H10N 10/13 | |
| 2022/0359925 A1 * | 11/2022 | Wang | H01M 10/635 | |
| 2023/0005813 A1 * | 1/2023 | Fujinaga | H10F 39/80 | |
| 2023/0010940 A1 * | 1/2023 | He | H10N 10/81 | |
| 2023/0098236 A1 * | 3/2023 | Tadele | G01K 7/427 | 374/29 |
| 2023/0099531 A1 * | 3/2023 | Tadele | G01K 7/02 | 374/30 |
| 2023/0099638 A1 * | 3/2023 | Clements | G01K 17/00 | 374/126 |
| 2023/0165147 A1 * | 5/2023 | Lee | H10N 10/817 | 136/224 |
| 2024/0060832 A1 * | 2/2024 | Huang | G01K 7/02 | |

FOREIGN PATENT DOCUMENTS

| | | | | |
|---|---|---|---|---|
| WO | WO-2021112566 A1 * | 6/2021 | | H10W 74/016 |
| WO | WO-2021149619 A1 * | 7/2021 | | A41D 13/0058 |

* cited by examiner

THERMOELECTRIC COOLING MODULES

CROSS-REFERENCE TO RELATED APPLICATIONS

This application claims the benefit under 35 U.S.C. § 119(e) of U.S. Provisional Patent Application No. 63/344,424, filed May 20, 2022, the contents of which are incorporated herein by reference in their entirety.

FIELD

The described embodiments relate generally to thermoelectric cooling modules. More particularly, the described embodiments describe thermoelectric coolers with suspended semiconductor elements.

BACKGROUND

Thermoelectric cooling modules (also called "thermoelectric coolers," "TE Coolers," or "TECs") are frequently used to provide small form factor cooling in electronic and photonic devices. Thermoelectric coolers rely on Peltier cooling that is achieved by driving a current through two dissimilar materials (typically an N-type semiconductor and a P-type semiconductor) that are electrically connected in series to form a thermocouple. Typically, several of these thermocouples are connected in series, which increases the amount of heat that may be transferred between a hot side and a cold side of the thermoelectric cooler. These thermocouples also provide physical support between the hot and cold sides of the thermoelectric cooler, which puts constraints on the size and shape of the thermocouples, and thereby limits the power efficiency of the thermoelectric cooler. Thus, thermoelectric coolers with increased power efficiency may be desirable.

SUMMARY

Described herein are thermoelectric cooling modules that transfer heat between two substrates. In some embodiments, a thermoelectric cooling module includes a first substrate, a second substrate, wherein the first substrate is positioned above the second substrate in a vertical stacking direction, a set of thermally-insulating support posts mechanically supporting the first substrate above the second substrate, and a thermoelectric connector connected to the first substrate and the second substrate. The thermoelectric connector includes a first terminal, a second terminal, and a plurality of semiconductor elements electrically coupled in series, wherein the thermoelectric connector thermally couples the first substrate to the second substrate. The thermoelectric connector is configured such that when a current is driven through the thermoelectric connector between the first terminal and the second terminal, heat flows laterally through at least a portion of each semiconductor element of the plurality of semiconductor elements in a corresponding lateral direction orthogonal to the vertical stacking direction.

In some of these variations, the one or more support posts are configured to provide an electrical connection between the first substrate and the second substrate. The plurality of semiconductor elements may include a first semiconductor element and a second semiconductor element. In some of these variations, the first semiconductor element includes a first portion and a second portion, wherein the first portion is thermally connected to the first substrate along the vertical stacking direction and the second portion is thermally separated from the first substrate along the vertical stacking direction. A top surface of the first portion may be positioned closer to the first substrate than a top surface of the second portion.

Additionally or alternatively, the first semiconductor element includes a third portion, wherein the second portion is positioned between the first portion and the third portion. The third portion may be thermally connected to the second substrate along the vertical stacking direction, and the second portion may be thermally separated from the second substrate along the vertical stacking direction. In some of these variations, a bottom surface of the third portion is positioned closer to the second substrate than a bottom surface of the second portion.

Other embodiments of the thermoelectric cooling modules described herein include a first substrate, a second substrate, wherein the first substrate is suspended above the second substrate in a vertical stacking direction, and a thermoelectric connector that thermally couples the first substrate to the second substrate and includes a plurality of semiconductor elements electrically coupled in series. In these variations, each semiconductor element of the plurality of semiconductor elements comprises a corresponding suspended portion that is thermally separated from the first substrate by a first distance along the vertical stacking direction and is thermally separated from the second substrate by a second distance along the vertical stacking direction.

In some of these variations, the first substrate is separated from the second substrate by a first distance, the corresponding suspended portion of each semiconductor element has a length in a corresponding lateral direction orthogonal to the vertical stacking direction, and the length of each suspended portion is longer than the first distance. Additionally or alternatively, each corresponding suspended portion has a length along a first lateral direction orthogonal to the vertical stacking direction, a width along a second lateral direction orthogonal to the first lateral direction and the vertical stacking direction, and a height along the vertical stacking direction, wherein the length and the width are both longer than the height.

In other variations, the plurality of semiconductor elements includes a first semiconductor element and a second semiconductor element having opposite conductivity types, and the thermoelectric connector includes an upper connector. The upper connector electrically connects the first semiconductor element to the second semiconductor element and thermally the first semiconductor element and the second semiconductor element to the first substrate. In some of these variations, the thermoelectric connector further includes a lower connector that thermally connects the first semiconductor element to the second substrate. In some instances, the plurality of semiconductor elements comprises a first pair of semiconductor elements and a second pair of semiconductor elements. Additionally or alternatively, the thermoelectric connector is positioned entirely between the first substrate and the second substrate along the vertical stacking direction.

In yet other embodiments, a thermoelectric cooling module includes a first substrate, a second substrate, wherein the first substrate is suspended above the second substrate in a vertical stacking direction, and a thermoelectric connector that thermally couples the first substrate to the second substrate. The thermoelectric connector includes a first semiconductor element having a first conductivity type and a second semiconductor element having a second conductivity type opposite the first conductivity type. The thermoelectric connector also includes an upper connector that electrically connects the first semiconductor element to the second semiconductor element, and that thermally connects the first semiconductor element and the second semiconductor element to the first substrate.

The thermoelectric connector may also include a first lower connecter spaced laterally from the upper connector in a first lateral direction orthogonal to a vertical stacking direction, wherein the first lower connector thermally connects the first semiconductor element to the second substrate, and a second lower connector spaced laterally from the upper connector in a second lateral direction orthogonal to the vertical stacking direction, wherein the first lower connector thermally connects the second semiconductor element to the second substrate. In some of these variations, the thermoelectric cooling module also includes a power source electrically connected to the first lower connector and the second lower connector to drive current through the thermoelectric connector. The power source may be electrically connected to the first lower connector and the second lower connector via corresponding electrical traces positioned on the second substrate.

In some variations, the first lateral direction is parallel to the second lateral direction. In other variations, a portion of the upper connector is positioned between a first portion of the first semiconductor element and the first substrate. Additionally or alternatively, a portion of the first lower connector is positioned between a second portion the first semiconductor element and the second substrate.

In addition to the exemplary aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which.

Figure 1:
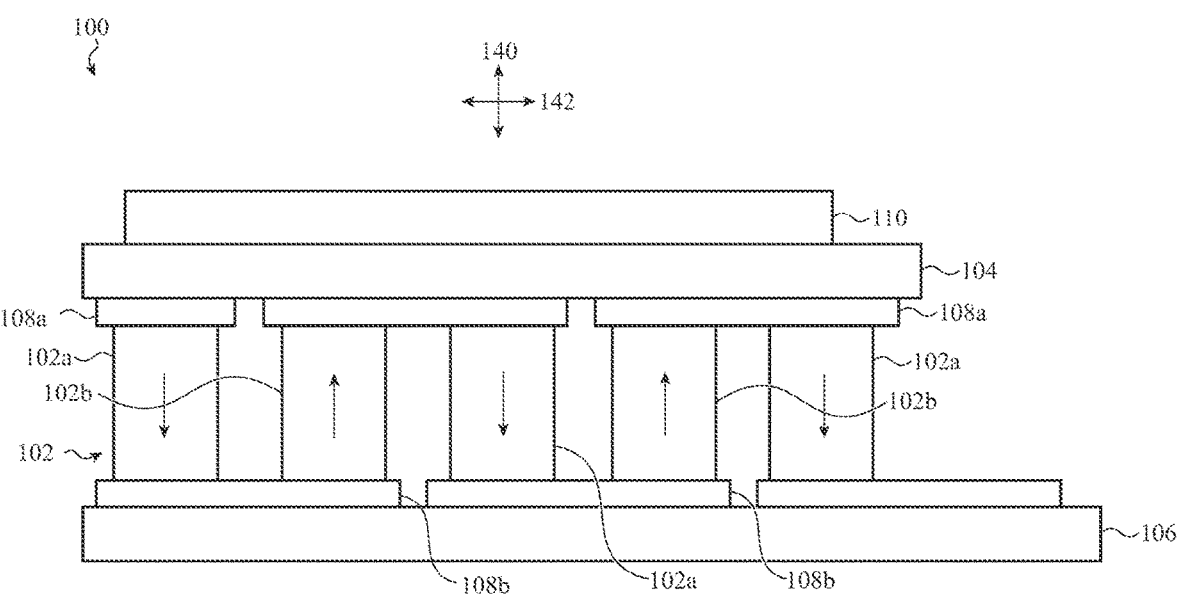
FIG. 1 is a side view of a thermoelectric cooling module.

It should be understood that the proportions and dimensions (either relative or absolute) of the various features and elements (and collections and subsettings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

Directional terminology, such as "top", "bottom", "upper", "lower", "front", "back", "over", "under", "above", "below", "left", "right", "vertical", "horizontal", etc. is used with reference some of the components in some of the figures described below, and is not intended to be limiting as to overall orientation of a given component. Because components in various embodiments can be positioned in a number of different orientations, directional terminology is used for purposes of illustration only. For example, a "top surface" of a first component need not have any particular relative orientation to a "top surface" of a different component or of a device incorporating the first component unless one is specified. The directional terminology is intended to be construed broadly, and therefore should not be interpreted to preclude components being oriented in different ways. Also, as used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

DETAILED DESCRIPTION

Reference will now be made in detail to representative embodiments illustrated in the accompanying drawings. It should be understood that the following descriptions are not intended to limit the embodiments to one preferred embodiment. To the contrary, it is intended to cover alternatives, modifications, and equivalents as can be included within the spirit and scope of the described embodiments as defined by the appended claims.

The following disclosure relates to embodiments of thermoelectric cooling modules having suspended semiconductor elements. The thermoelectric cooling modules described here include a first substrate that is positioned above a second substrate along a vertical stacking direction, and further include one or more thermoelectric connectors, each of which is connected to both the first substrate and the second substrate to thermally couple the first substrate to the second substrate. Each thermoelectric connector includes a plurality of semiconductor elements that are electrically connected in series, which causes the thermoelectric connectors to transfer heat between the first and second substrates when a current is passed through the semiconductor elements.

The thermoelectric connectors described here each include a first terminal and a second terminal which can be connected to a power source to drive current through the thermoelectric connector. The thermoelectric connecter is configured such that when current is driven through the thermoelectric connector between the first terminal and the second terminal, heat flows laterally through at least a portion of each of the plurality of semiconductor elements in a corresponding lateral direction orthogonal to the vertical stacking direction. The thermoelectric connector may be configured such that heat flows in a common lateral direction for each of the plurality of semiconductor elements, or alternatively may be configured such that heat flows in different lateral directions for different semiconductor elements.

To facilitate lateral heat transfer, each semiconductor element includes a suspended portion that is thermally separated from the first substrate by a first distance along the vertical stacking direction and is thermally separated from the second substrate by a second distance along the vertical stacking direction. The thermoelectric cooling module may be configured such that heat transferred by the thermoelectric connectors between the first and second substrates moves in the suspended portions of the semiconductor elements laterally relative to the vertical stacking direction.

The suspended portion of a semiconductor element may have a relatively high effective aspect ratio in this lateral direction. As used herein, the "effective aspect ratio" of a semiconductor element refers to the ratio of the length of its dimension in a direction of current flow (when used to transfer heat) to its cross-sectional area in a plane perpendicular to the direction of current flow. The effective aspect ratio is tied to the internal heat loss of a semiconductor element, where semiconductor elements having a higher effective aspect ratio (i.e., that are longer in the direction of current flow for a given cross-sectional area) will exhibit less internal heat loss than a semiconductor element with a relatively lower effective aspect ratio (i.e., that are shorter in the direction of the current flow for the same cross-sectional area). As a result, a semiconductor element with less internal heat loss will require less power to achieve a given amount of heat transfer.

Additionally, certain variations of the thermoelectric cooling modules described here include a set of support posts that hold the first substrate above the second substrate in the vertical stacking direction. The support posts may be thermally insulating, and thereby provide mechanical support between the first and second substrates without significantly impacting the heat transfer between the first substrate and the second substrate. In these instances, the thermoelectric connectors are not directly responsible for supporting the first substrate relative to the second substrate, which relaxes the mechanical strength requirements of the set of thermoelectric connectors relative to conventional thermoelectric electric cooling modules.

These and other embodiments are discussed with reference to FIGS. 2A-5B. However, those skilled in the art will readily appreciate that the detailed description given herein with respect to these figures is for explanatory purposes only and should not be construed as limiting.

The terms "connect" and "connected," as used herein, refer to two or more elements, structures, objects, components, parts, or the like that are physically affixed, fastened, and/or retained relative to one another. Two elements are directly connected when they are connected in direct contact with each other (i.e., without an intervening component), whereas two elements are indirectly connected if they are connected via one or more intervening components. The terms "electrically coupled" and "electrically connected," as used herein, refer to two elements that are connected in a manner that allows electrical current to pass between the elements. These elements (and any intervening elements) are formed from or otherwise include one or more electrically-conductive materials to facilitate the transfer of electrical current therebetween.

The terms "thermally coupled" and "thermally connected," as used herein, refer to two elements that are connected, directly or indirectly, in a manner that allows to heat transfer between the two elements. These elements (and any intervening elements) are formed from or otherwise include one or more thermally-conductive materials to facilitate the transfer of heat therebetween. As discussed herein, a "thermally-conductive material" is a material having a thermal conductivity of greater than or equal to 50 Watts per meter-kelvin at 20 degrees Celsius, whereas a "thermally-insulating material" is a material having a thermal conductivity of less than Watts per meter-kelvin at 20 degrees Celsius. The terms "thermally separated" and "thermal separation," as used herein, refer to corresponding portions of two elements that are separated by a space or distance across which the two elements are not thermally connected (e.g., are separated by a gap that is under vacuum and/or filled with one or more thermally-insulating materials). It should be appreciated, as discussed in more detail below, that two elements may be thermally connected, but still have portions thereof that are thermally separated.

FIG. 1 shows an example of a conventional thermoelectric cooling module 100. As shown there, the thermoelectric cooling module 100 includes a plurality of semiconductor elements 102 that is used to transfer heat between a first substrate 104 and a second substrate 106. The first substrate 104 is positioned above the second substrate 106 along a vertical stacking direction 140. The plurality of semiconductor elements 102 includes a set of P-type semiconductor elements 102a formed from a P-type semiconductor and a set of N-type semiconductor elements 102b formed from an N-type semiconductor. The semiconductor elements 102 are connected in series electrically and connected in parallel thermally to facilitate heat transfer between the first substrate 104 and the second substrate 106.

Specifically, the thermoelectric cooling module 100 includes a plurality of upper electrical traces 108a and a plurality of lower electrical traces 108b that provide thermal and electrical connections between components of the thermoelectric cooling module 100. For each semiconductor element 102, a corresponding upper electrical trace 108a is positioned between semiconductor element 102 and the first substrate 104 to physically and thermally connect the semiconductor element 102 to the first substrate 104. Similarly, for each semiconductor element 102, a corresponding lower electrical trace 108b is positioned between semiconductor element 102 and the second substrate 106 to physically and thermally connect the semiconductor element 102 to the first substrate 104.

Additionally, the some of the upper and lower electrical traces 108 may electrically connect a P-type semiconductor element 102a to an N-type semiconductor element 102b to electrically connect these connectors to form a thermocouple. When a current passes through the P-type and N-type semiconductor elements 102a, 102b of a thermocouple, a temperature differential is created between the upper electrical traces (or traces) connected to the thermocouple and the lower electrical trace (or traces) connected to the thermocouple. As depicted in FIG. 1, multiple thermocouples may be electrically connected in series such that current alternates between passing through a P-type semiconductor element 102a and an N-type semiconductor element 102b. If current is passed through the couples in the directions indicated by the arrows in the semiconductor elements 102 in FIG. 1, the semiconductor elements 102 will transfer heat from the first substrate 104 to the second substrate 106. Conversely, driving current through the couples in an opposite direction will transfer heat from the second substrate 106 to the first substrate 104. In this way, the thermoelectric cooling module 100 may be used to selectively heat or cool an additional component 110.

In the thermoelectric cooling module 100 shown in FIG. 1, the upper electrical trace 108a connected to a given semiconductor element 102 is positioned directly over the lower electrical trace 108b connected to that semiconductor element 102 along the vertical stacking direction 140. As a result, current flows vertically through the semiconductor elements 102 along the vertical stacking direction 140, which results in the heat being transferred vertically through the semiconductor elements 102. Within a given electrical trace (e.g., an upper electrical trace 108a or a lower electrical trace 108b), current may flow laterally (i.e., in a lateral direction 142 transverse to the vertical stacking direction 140) to transfer current between semiconductor elements).

The plurality of semiconductor elements 102 provide mechanical support to the first substrate 104 to suspend the first substrate 104 relative to the second substrate 106. The need to provide this mechanical support puts certain mechanical strength requirements on the semiconductor elements 102, which limits how tall the semiconductor elements 102 may be in the vertical stacking direction 140 relative to the cross-sectional area in a plane perpendicular to the vertical stacking direction 140. Because current also flows vertically along the vertical stacking direction 140, this places limits on the effective aspect ratios of the various semiconductor elements 102, thereby limiting how much internal heat loss can be minimized within the semiconductor element 102. This limits the efficiency of the thermoelectric cooling module 100 by requiring additional power consumption to overcome this internal heat loss while operating the thermoelectric cooling module 100.

Figure 2A:
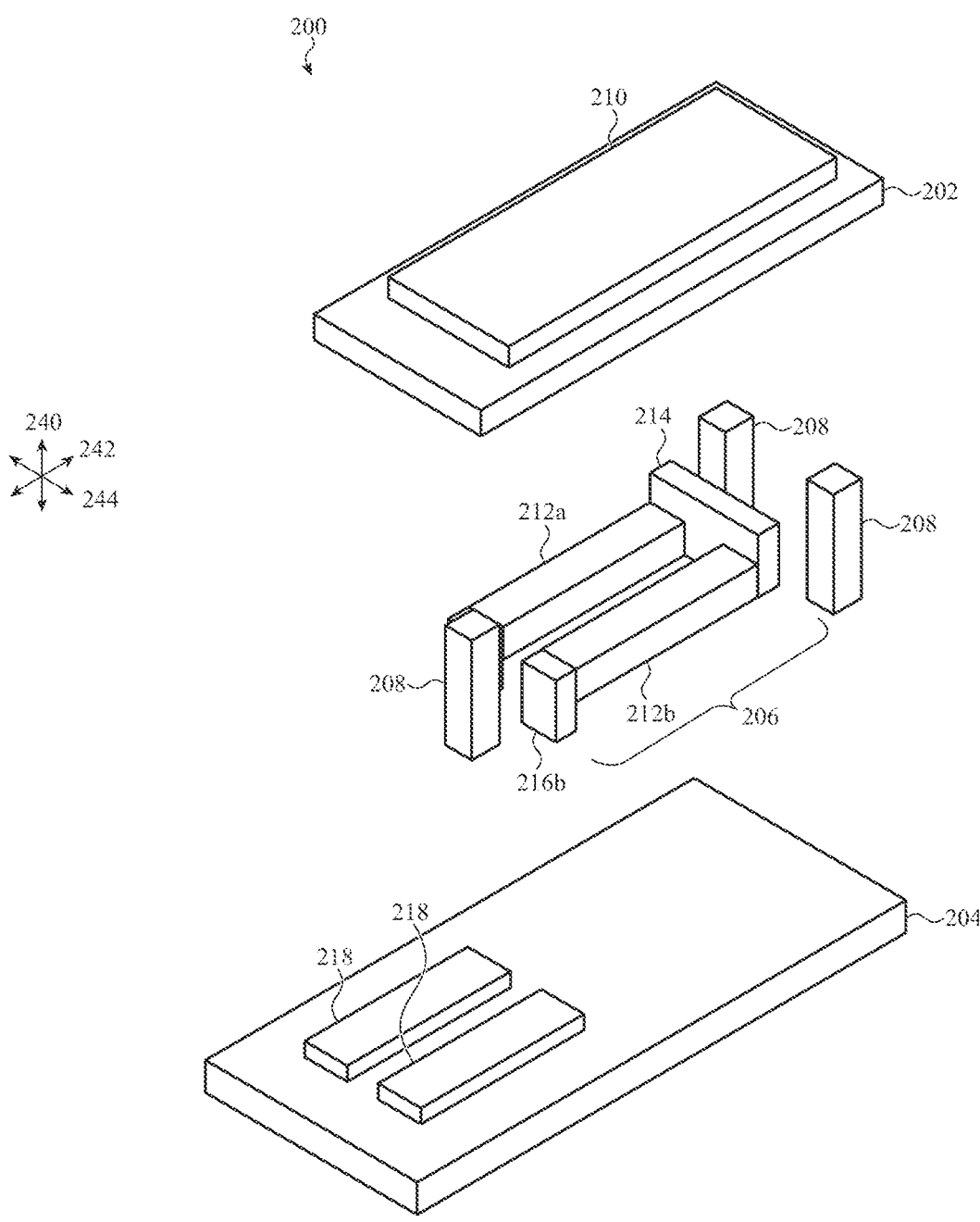
FIGS. 2A-2C show an exploded perspective view, a side view, and a top view, respectively, of a thermoelectric cooling module having a suspended semiconductor element.
Figure 2B:
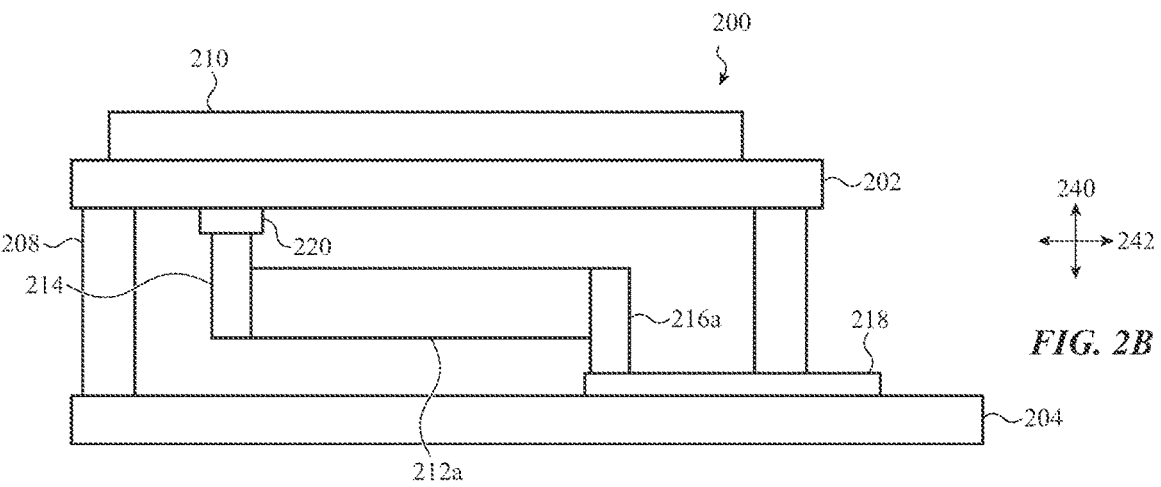
Figure 2C:
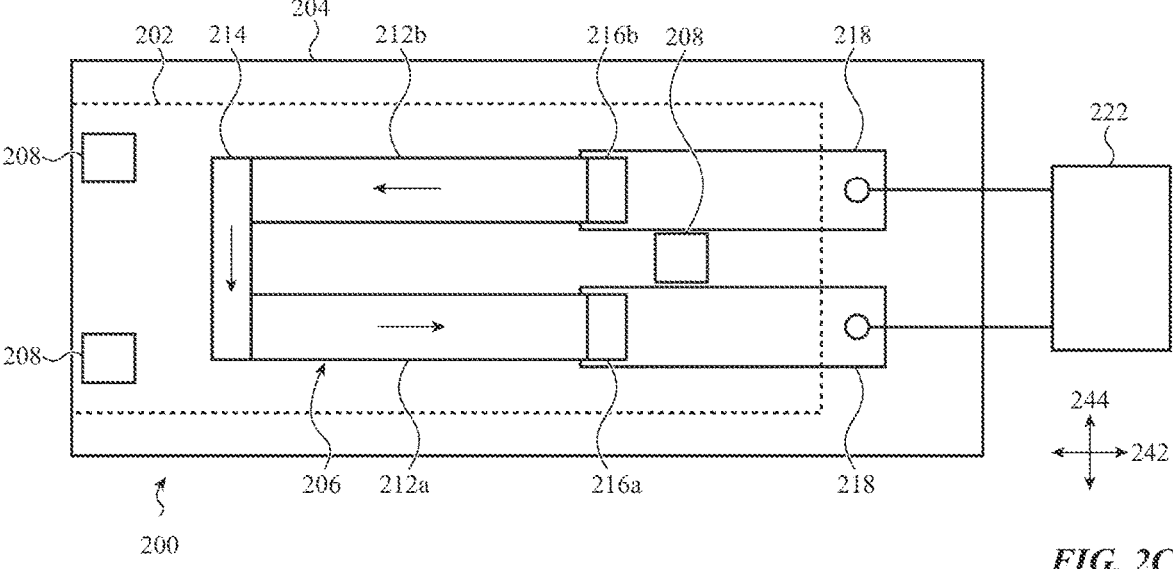

Conversely, the thermoelectric cooling modules described here use dedicated support posts to suspend a first substrate over a second substrate in a vertical stacking direction. For example, FIGS. 2A-2C depict an exploded perspective view, a side view, and a top view, respectively, of a thermoelectric cooling module 200 as described herein. As shown there, the thermoelectric cooling module 200 includes a first substrate 202 (shown in phantom in FIG. 2C) suspended over a second substrate 204 in a vertical stacking direction 240 that is perpendicular to a corresponding surface of each of the first substrate 202 and the second substrate 204, a thermoelectric connector 206, and a set of support posts 208. The thermoelectric connector 206 is connected to the first substrate 202 and the second substrate 204 to thermally couple the first and second substrates to transfer heat therebetween when a current is passed through the thermoelectric connector 206. This may be used to selectively cool or heat an additional component 210 that is thermally coupled to the first substrate 202. The component 210 is depicted in FIGS. 2A and 2B for the purpose of illustration only, and the thermoelectric cooling modules described here may be used with any component or components for which it is desirable to regulate the temperature thereof (and these components can be connected to either the first substrate or the second substrate).

The set of support posts 208 are connected to the first substrate 202 and the second substrate 204, and provide mechanical support to suspend the first substrate 202 relative to the second substrate 204 (or vice versa). The support posts 208 are thermally-insulating (i.e., formed from one or more thermally-insulating materials) so as to minimize heat loss between the first substrate 202 and the second substrate 204 through the support posts 208. The support posts 208 may be made from any thermally-insulating material or materials that have sufficient mechanical strength to support the first substrate 202 relative to the second substrate 204, such as polyimide, stainless steel, or the like. While three support posts 208, each having a rectangular cross-sectional shape, are shown in FIGS. 2A-2C, it should be appreciated that the thermoelectric cooling module may include any number of support posts 208 having any combination of cross-sectional shapes and dimensions as may be desired to support the first substrate 202 relative to the second substrate 204.

In some instances, one or more of the support posts 208 is configured to form an electrical connection between the first substrate 202 and the second substrate 204, which may allow for power and/or electrical signals to be passed between one or more components carried by the first substrate 202 and one or more components carried by the second substrate 204. For example, one or more of the support posts 208 may be formed from an electrically-conductive material such as stainless steel, which may be used to carry power and/or electrical signals between the substrates. This may reduce the need for wire bonds or other electrical connections to the component 210, which may be a source of heat loss when regulating the temperature of the component 210.

Because the set of support posts 208 provides mechanical support between the first substrate 202 and the second substrate 204, the thermoelectric connector 206 may be designed to prioritize efficient heat transfer between the first substrate 202 and the second substrate 204. As shown in FIGS. 2A-2C, the thermoelectric connector 206 includes a pair of semiconductor elements having opposite conductivity types, specifically a P-type semiconductor element 212a and an N-type semiconductor element 212b. The pair of semiconductor elements are electrically connected in series, which allows the pair of semiconductor elements to act as a thermocouple. The semiconductor elements may be made from any suitable thermoelectric materials, such as bismuth telluride, bismuth antimonide, silicon germanium, or the like.

Specifically, the thermoelectric coupler 206 includes an upper connector 214 that connects the P-type semiconductor element 212a to the N-type semiconductor element 212b, and connects the pair of semiconductor elements to the upper substrate. The upper connector 214 electrically connects the P-type semiconductor element 212a to the N-type semiconductor element 212b, thereby allowing current to pass between P-type semiconductor element 212a and the N-type semiconductor element 212b. Additionally, the upper connector 214 thermally connects the pair of semiconductor elements to the first substrate 202. In some instances, the upper connector 214 is entirely formed from a material (or materials) that is both electrically-conductive and thermally-conductive, such as copper. In other instances, only a portion of the upper connector 214 is formed from electrically-conductive and thermally-conductive materials that are positioned to provide these thermal and electrical connections.

In some variations, it may be desirable to electrically isolate the upper connector 214 from the first substrate 202, such that current introduced through the upper connector 214 via the pair of semiconductor elements does not reach the first substrate 202. For example, as shown in FIG. 2B, an insulating trace 220 (which is formed from a thermally-conductive and electrically-insulating material) is positioned between the upper connector 214 and the first substrate 202, which electrically isolates the upper connector 214 from the first substrate 202 while still allowing the upper connector 214 to be thermally connected to the first substrate 202. In other variations, the upper connector 214 may be directly connected to the first substrate 202, where the portion of the first substrate 202 in contact with the upper connector 214 is formed from one or more electrically-insulating and thermally-conductive materials (e.g., sapphire).

The thermoelectric connector 206 also has a pair of lower connectors that includes a first lower connector 216a and a second lower connector 216b. The first and second lower connectors 216a, 216b respectively connect the P-type and N-type semiconductor elements 212a, 212b to the second substrate 204. The first lower connector 216a thermally connects the P-type semiconductor element 212a to the second substrate, and the second lower connector 216b thermally connects the N-type semiconductor element 212b to the second substrate 204. The lower connectors may act as first and second terminals to electrically connect the pair of semiconductor elements to a power source to operate. For example, each of the first lower connector 216a and second lower connector 216b may be electrically connected to a corresponding electrical trace 218 positioned on the second substrate 204. The electrical traces 218 may in turn be connected to a power source 222, which may be used to drive current through the thermoelectric connector 206 to transfer heat between the first and second substrates as will be discussed below.

As shown in FIGS. 2A-2C, the pair of semiconductor elements are positioned relative to the first and second substrates 202, 204 such that a suspended portion of each semiconductor element (i.e., the P-type semiconductor element 212a and the N-type semiconductor element 212b) is thermally separated from the first substrate 202 along the vertical stacking direction 240 and is thermally separated from the second substrate 204 along the vertical stacking direction 240. As shown in a side view in FIG. 2B, a top surface (i.e., the surface facing the first substrate) of each of the P-type and N-type semiconductor elements 212a, 212b is separated from the first substrate 202 along the vertical stacking direction 240 by a first distance, which may include a gap and/or a thermally-insulating material between the top surface of the semiconductor element and the first substrate 202. Similarly, a bottom surface (i.e., the surface facing the second substrate) of each of the P-type and N-type semiconductor elements 212a, 212b is separated from the second substrate 204 along the vertical stacking direction 240 by a second distance, which may include a gap and/or a thermally-insulating material between the bottom surface of the semiconductor element and the second substrate 204. The first distance and the second distance may be the same, but need not be. Additionally, the first distance and/or the second distance may change across a semiconductor element in a direction perpendicular to the vertical stacking direction 240. The thermal separation between the semiconductor elements and the first substrate 202 and the second substrate 202 minimizes heat transfer along the vertical stacking direction 240 in the suspended portion of the semiconductor elements.

In some variations, the upper and lower connectors may hold the semiconductor elements to suspend each semiconductor element between the first substrate 202 and the second substrate 204, such that each semiconductor element is physically separated from the first substrate 202 by the upper connector and is physically separated from the second substrate 204 by a corresponding lower connector. In some variations, the upper connector 214 is laterally spaced from each of the first and second lower connectors 216a, 216b along corresponding lateral directions that are perpendicular to the vertical stacking direction 240. In the variation shown in FIGS. 2A-2C, the upper connector 214 is laterally spaced from the first and second lower connectors 216a, 216b along parallel directions (e.g., along a first lateral direction 242 that is orthogonal to the vertical stacking direction 240). When laterally spaced, the upper connector 214 does not overlap either of the lower connectors 216a, 216b along the vertical stacking direction 240. A first end of each of the semiconductor elements 212a, 212b is connected to the upper connector 214, and a second end of the semiconductor elements 212a, 212b is connected to its corresponding lower connector 216a, 216b. This may facilitate lateral current and heat flow in a direction or directions orthogonal to the vertical stacking direction 240.

For example, when a power source (e.g., power source 222 in FIG. 2C) is connected to the lower connectors 216a, 216b (e.g., via electrical traces 218), a potential may be applied across the lower connectors 216a, 216b to drive current through the thermoelectric connecter 216. Specifically, current may flow sequentially (as indicated by arrows overlaying these elements in FIG. 2C) through the second lower connector 216b, the N-type semiconductor element 212b, the upper connector 214, the P-type semiconductor element 212a, and the first lower connector 216a to draw heat from the first substrate 202 to the second substrate 204 (or in an opposite direction to draw heat from the second substrate 204 to the first substrate 202). Because the upper connector 214 is laterally spaced from the lower connectors 216a, 216b, current flows laterally (i.e., in a direction perpendicular to the vertical stacking direction) through the suspended portions of the semiconductor elements.

As a result, heat will also be transferred laterally through the suspended portions of the semiconductor elements of the thermoelectric connecter 206. In this way, although the suspended portions of the semiconductor elements are thermally separated from the first and second substrates 202, 204 along the vertical stacking direction 240, this lateral heat transfer still allows the suspended portions of the semiconductor elements to thermally connect the first substrate 202 to the second substrate 204. Specifically, when the thermoelectric connector 206 is used to draw heat from the first substrate 202 to the second substrate 204, heat may flow from the first substrate 202 in the vertical stacking direction 240 through the upper connector 214 to reach the pair of semiconductor elements, may flow in a lateral direction or directions (e.g., first lateral direction 242) through the semiconductor elements 212a, 212b to reach the lower connectors 216a, 216b, and may flow in the vertical stacking direction 240 through the lower connectors 216a, 216b to reach to the second substrate 204. While the pair of semiconductor elements 212a, 212b as shown in FIG. 2C are positioned such that current flows in parallel directions (e.g., along first lateral direction 242) through the semiconductor elements 212a, 212b, it should be appreciated that one of the semiconductor elements may be positioned along another direction (e.g., a second lateral direction 244) so that the current flowing through the semiconductor element is not parallel.

When a thermoelectric connector 206 is configured such that current flows laterally through the suspended portions of the semiconductor elements as discussed above, the semiconductor elements may allow for an improved effective aspect ratio, and thus less internal heat loss, relative to conventional thermoelectric cooling modules. Specifically, if the length for the purposes of calculating effective aspect ratio is a dimension orthogonal to the vertical stacking direction, this length does not depend on the distance between the first substrate 202 and the second substrate 204 along the vertical stacking direction 240, and in some instances may even be longer than the distance between the substrates. This allows for an increase in the effective aspect ratio of the suspended portions of semiconductor elements described herein as compared to the semiconductor elements of conventional thermoelectric cooling modules.

Accordingly, the suspended portion of each semiconductor element may be configured such that its longest dimension (i.e., its length) is in the same direction that current flows during operation of the thermoelectric cooling module 200 (i.e., the direction along which the upper connector 214 is laterally spaced from the corresponding lower connector). Accordingly, each of the semiconductor elements 212a, 212b may be longer in the direction of current flow (e.g., along first lateral direction 242 in the embodiment shown in FIGS. 2A-2C) relative to its cross-sectional area in a plane perpendicular to current flow (e.g., in a plane defined by vertical stacking direction 240 and a second lateral direction 244 perpendicular to both the vertical stacking direction 240 and the first lateral direction 242) when compared to conventional thermoelectric cooling modules, and thus will have less internal heat leakage. Because there is less internal heat leakage, the thermoelectric cooling module 200 will require less current to achieve a target amount of heat transfer between the first substrate 202 and the second substrate 204.

Additionally, in some variations the cross-section of the suspended portion of each semiconductor element is shorter in the vertical stacking direction 240 (its height) than in the second lateral direction 244 (its width). In these instances, the suspended portion of each semiconductor element is both longer (e.g., along the first lateral direction 242) and wider (e.g., along the second lateral direction 244) than its height along the vertical stacking direction. By reducing the height relative to the width of the semiconductor element, a thermoelectric cooling module may still obtain a similar amount of internal heat loss while allowing for the first substrate 202 to be positioned closer to the second substrate 204, thereby reducing the overall height of the thermoelectric cooling module 200.

Figure 3:
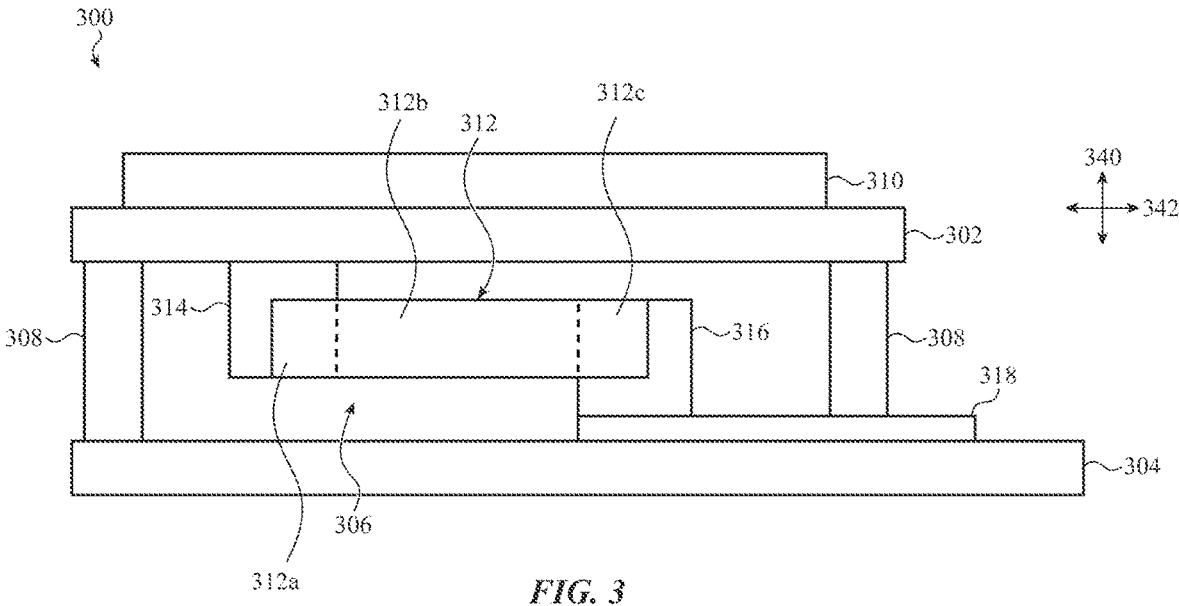
FIG. 3 shows a side view of another variation of a thermoelectric cooling module having a suspended semiconductor element.

In the variation shown in FIGS. 2A-2C, the entirety of the semiconductor elements 212a, 212b are thermally separated from the first substrate 202 and the second substrate 204 along the vertical stacking direction. In other variations, only a sub-portion of a semiconductor element is thermally separated from the first substrate 202 and the second substrate 204. For example, FIG. 3 shows a side view of one such variation of a thermoelectric cooling module 300, which includes a first substrate 302 suspended over a second substrate 304 in a vertical stacking direction 340, a thermoelectric connector 306 that thermally connects the first substrate 302 to the second substrate 304, and a set of thermally-insulating support posts 308. These components may all be configured and the thermoelectric cooling module 300 may operate as described with respect to FIGS. 2A-2C to transfer heat between the first substrate 302 and the second substrate 304 (e.g., to selectively cool or heat an additional component 310).

The difference between the thermoelectric cooling module 300 of FIG. 3 and the thermoelectric cooling module 200 of FIGS. 2A-2C is that thermoelectric connector 306 includes a pair of semiconductor elements, where only a sub-portion of one or both of the semiconductor elements is thermally separated from the first substrate 302 and the second substrate 304. For example, as shown in FIG. 3 the thermoelectric connector 306 includes a first semiconductor element 312 having a first conductivity type (e.g., a P-type semiconductor element or an N-type semiconductor element), an upper connector 314, and a first lower connector 316. The thermoelectric connector 306 further includes a second semiconductor element having an opposite conductivity type (not shown) that is electrically connected in series with the semiconductor element 312 to form a thermocouple.

The upper connector 314 electrically connects the semiconductor element 312 to the second semiconductor element, and thermally connects the pair of semiconductor elements to the first substrate 302 as discussed above. In the variation shown in FIG. 3, the upper connector 314 is shaped such that a portion of the upper connector 314 is positioned between a first portion 312a of the first semiconductor element 312 and the first substrate 302. When the portion of the upper connector 314 is positioned between a first portion 312a of the first semiconductor element 312 and the first substrate 302 is formed from a thermally-conductive material, the upper connector 314 may thermally connect the first portion 312a of the first semiconductor 312 to the first substrate 302 along the vertical stacking direction 340. As a result, the first portion 312a of the first semiconductor 312 is thermally separated from the second substrate 304 but is not thermally separated from the first substrate 302 along the vertical stacking direction 340. Additionally or alternatively, the upper connector 314 may be shaped such that a portion of the upper connector 314 is positioned between a first portion of the second semiconductor element and the first substrate 302 to thermally couple the two along the vertical stacking direction 340. In these instances, positioning a portion or portions of the upper connector 314 between one or both of the pair of semiconductor elements may help to set the relative position vertical positioning between the semiconductor element or elements and the first substrate.

Additionally or alternatively, the first lower connector 316 may be shaped such that a portion of the first lower connector 316 is positioned between a third portion 312c of the first semiconductor element 312 and the second substrate 304. When the portion of the first lower connector 316 is positioned between a third portion 312c of the first semiconductor element 312 and the second substrate 304 is formed from a thermally-conductive material, the first lower connector 316 may thermally connect the third portion 312c of the first semiconductor 312 to the second substrate 304 along the vertical stacking direction 340. As a result, the third portion 312c of the first semiconductor 312 is thermally separated from the first substrate 302 but is not thermally separated from the second substrate 302 along the vertical stacking direction 340. Additionally or alternatively, the thermoelectric connector 306 may include a second lower connector that may be shaped such that a portion of the second lower connector is positioned between a third portion of the second semiconductor element and the second substrate 304 to thermally couple the two along the vertical stacking direction 340. In these instances, positioning a portion of a lower connector between a semiconductor element and the second substrate 304 may help to set the relative position vertical positioning between these elements.

As shown in FIG. 3, the first semiconductor element 312 includes a second portion 312b that is positioned between the first portion 312a and the third portion 312c and acts as the suspended portion of the first semiconductor element 312. Specifically, the second portion 312b is thermally separated from the first substrate 302 along the vertical stacking direction 340 and is thermally separated from the second substrate 304 along the vertical stacking direction 340. Similarly, the second semiconductor element may include a second portion, positioned between a first and third portion of the second semiconductor element, that acts as a suspended portion that is thermally separated from the first substrate 302 along the vertical stacking direction 340 and is thermally separated from the second substrate 304 along the vertical stacking direction 340.

When current is driven through the thermoelectric connector 306 (e.g., using the first lower connector and second lower connector as terminals, such as via electrical traces 318 connected to each of the lower connectors), current will flow laterally (e.g., along a first lateral direction 342 orthogonal to the vertical stacking direction 340) through the suspended portions of the pair of semiconductor elements, which also results in lateral heat transfer through the suspended portions of the semiconductor elements. This allows the pair of semiconductor elements to be formed with higher effective aspect ratios and thereby operate with improved power efficiency relative to conventional thermoelectric cooling modules.

Figure 4:
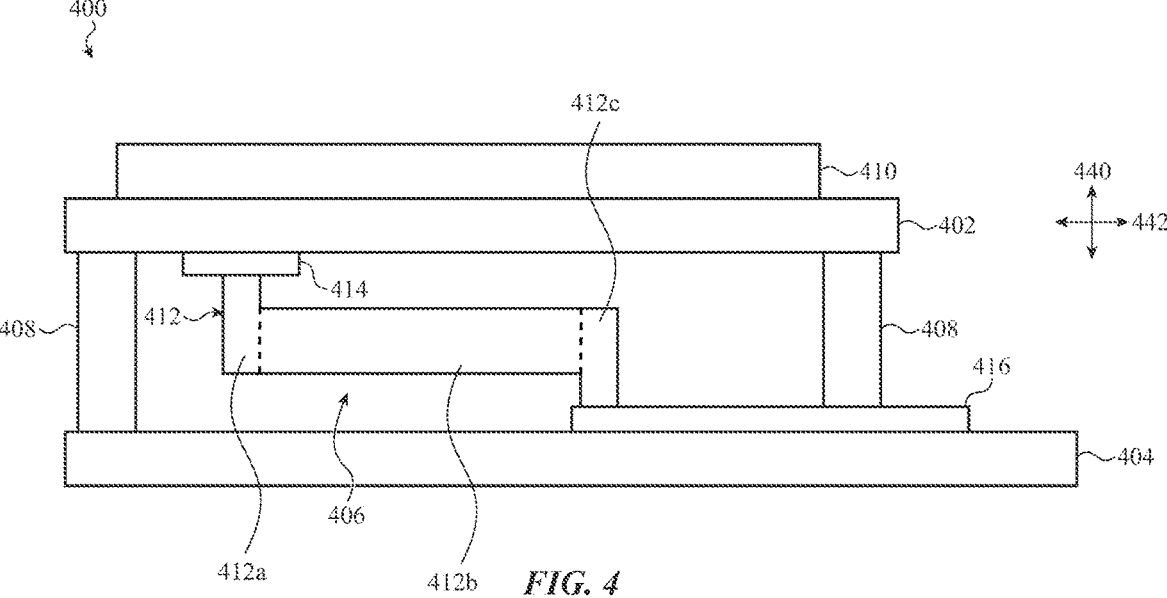
FIG. 4 shows a side view of another variation of a thermoelectric cooling module having a suspended semiconductor element.

In other variations, the thermoelectric cooling modules described here may not include upper connectors and/or lower connectors that suspend a portion of the semiconductor elements relative to the first and second substrates. FIG. 4 shows a side view of one such variation of a thermoelectric cooling module 400 as described herein. The thermoelectric cooling module 400 includes a first substrate 402 suspended over a second substrate 404 in a vertical stacking direction 440, a thermoelectric connector 406 that thermally connects the first substrate 402 to the second substrate 404, and a set of support posts 408. The set of support posts 408 is connected to the first substrate 402 and the second substrate 404, and may provide mechanical support to suspend the first substrate 402 relative to the second substrate 404 as discussed above.

The thermoelectric connector 406 has a pair of semiconductor elements including a first semiconductor element 412 having a first conductivity type (e.g., a P-type semiconductor element or an N-type semiconductor element) and a second semiconductor element (not shown) having an opposite conductivity type. The first semiconductor element 412 includes a first portion 412a, a second portion 412b, and a third portion 412c. The first portion 412a is connected to the first substrate 402 (either directly or indirectly via a thermally-conductive trace 414 as shown in FIG. 4) to thermally connect the first portion 412a to the first substrate 402 along the vertical stacking direction 440. To facilitate the connection to the first substrate 402, the semiconductor element 412 is shaped and positioned such that a top surface of the first portion 412a is positioned closer to the first substrate 402 along the vertical stacking direction 440 than corresponding top surfaces of the second and third portions 412b, 412c. The first portion 412a is thermally separated from the second substrate 404 along the vertical stacking direction 440.

Similarly, the third portion 412c is connected to the second substrate 404 (either directly or indirectly via a thermally-conductive trace 416 as shown in FIG. 4) to thermally connect the third portion 412c to the second substrate 404 along the vertical stacking direction 440. To facilitate the connection to the second substrate 404, the semiconductor element 412 is shaped and positioned such that a bottom surface of the third portion 412c is positioned closer to the second substrate 404 along the vertical stacking direction 440 than corresponding bottom surfaces of the first and second portions 412a, 412b. The third portion 412c is thermally separated from the first substrate 402 along the vertical stacking direction 440.

The second portion 412b, which is positioned between the first portion 412a and the third portion 412c is thermally separated from both the first substrate 402 and the second substrate 404. As such, the second portion 412b may act as the suspended portion of the first semiconductor element 412 during operation of the thermoelectric cooling module 400, such as described with respect to the thermoelectric cooling modules of FIGS. 2A-2C and 3 It should be appreciated that the second semiconductor element, though not depicted in FIG. 4, may similarly be configured to have the first, second, and third portions with the same connections to the first and second substrates 402, 404. These semiconductor elements may allow for improved power efficiency during heat transfer as discussed previously.

To complete the thermocouple, the first portion 412a of the first semiconductor element 412 is electrically connected to the first portion of the second semiconductor element, for example via thermally-conductive trace 414 (which in these instances is also electrically-conductive) or via another electrically-conductive material positioned between the pair of semiconductor elements. Similarly, the third portion 412c of the first semiconductor element 412 and the third portion of the second semiconductor element are each electrically connected to a power source (not shown), such that current may be driven through the thermoelectric connector 406. Specifically, current may be driven by the power source through the first semiconductor element 412 (i.e., through the third portion 412c, then the suspended second portion 412b, and then the first portion 412a thereof) and then through the second semiconductor element (i.e., through the first portion, then the suspended second portion, then the third portion thereof), or vice versa. As a result, heat will be transferred along the vertical stacking direction 440 in the first and third portions of each semiconductor element, and will be transferred laterally (e.g., along a first lateral direction 442 orthogonal to the vertical stacking direction 440). This may be used to selectively transfer heat to or away from an additional component 410.

While the embodiments described previously all depict thermoelectric cooling modules having a thermoelectric connector with a single pair of semiconductor elements, it should be appreciated that any of the thermoelectric cooling modules described here may include multiple thermoelectric connectors that are independently operable and/or a thermoelectric connector that has more than two semiconductor elements electrically connected in series. FIGS. and 5B show top and side views of one such variation of a thermoelectric cooling module 500. The thermoelectric cooling module 500 includes a first substrate 502 (depicted in phantom in FIG. 5A) that is suspended over a second substrate 504 along a vertical stacking direction 540 by a set of thermally-insulating support posts 508, and a thermoelectric connector 506 that thermally connects the first substrate 502 to the second substrate 504.

The thermoelectric connector 506 comprises a first pair of semiconductor elements and a second pair of semiconductor elements, where each pair has semiconductor elements having opposite conductivity types. The four semiconductor elements are electrically connected in series such that current alternatively flows through semiconductor elements of opposite conductivity types. For example, in the example shown in FIG. 5A, the first pair of semiconductor elements includes a P-type semiconductor element 510a and the N-type semiconductor element 510b, and the second pair of semiconductor elements includes a P-type semiconductor element 512a and an N-type semiconductor element 512b. These elements are electrically connected in series such that current flows through P-type semiconductor element 510a, then N-type semiconductor element 501b, then P-type semiconductor element 512a, then N-type semiconductor element 512*b* (or vice versa) to transfer heat between the first and second substrates 502, 504.

The individual semiconductor elements may be configured in a combination of manners as described with respect to FIGS. 2A-4. In the variation shown in FIG. 5, the semiconductor elements of the thermoelectric connector 506 are each configured such that the entire semiconductor element acts as a suspended portion and is thermally separated from both the first substrate 502 and the second substrate 504 along the vertical stacking direction 540.

Specifically, the thermoelectric connector 506 includes a first lower connector 516*a* that connects P-type semiconductor element 510*a* of the first pair to the second substrate 504, thereby thermally connecting the P-type semiconductor element 510*a* of the first pair to the second substrate 504. The first lower connector 516*a* may also electrically connect the P-type semiconductor element 510*a* of the first pair to an electrical trace 518. The thermoelectric connector 506 further comprises a first upper connector 514*a* that connects the first pair of the semiconductor element to each other and to the first substrate 502. The first upper connector 514*a* electrically connects the P-type semiconductor elements 510*a* to the N-type semiconductor element 510*b* of the first pair, and thermally connects the first pair of semiconductor elements to the first substrate 502.

Similarly, the thermoelectric connector 506 includes a second lower connector 516*b* that connects N-type semiconductor element 512*b* of the second pair to the second substrate 504, thereby thermally connecting the N-type semiconductor element 512*b* of the second pair to the second substrate 504. The second lower connector 516*b* may also electrically connect the N-type semiconductor element 512*b* of the second pair to an electrical trace 518. The thermoelectric connector 506 further comprises a second upper connector 514*b* that connects the second pair of the semiconductor elements to each other and to the first substrate 502. The second upper connector 514*b* electrically connects the P-type semiconductor element 512*a* to the N-type semiconductor element 512*b* of the second pair, and thermally connects the second pair of semiconductor elements to the first substrate 502.

Additionally, the thermoelectric connector 506 includes a third lower connector 516*c* that connects the N-type semiconductor element 510*b* of the first pair and the P-type semiconductor element 512*a* of the second pair to each other and to the second substrate. The third lower connector 516*c* electrically connects the N-type semiconductor element 510*b* of the first pair to the P-type semiconductor element 512*a* of the second pair, and thermally connects the N-type semiconductor element 510*b* of the first pair and the P-type semiconductor element 512*a* of the second pair to the second substrate 504.

Figure 5A:
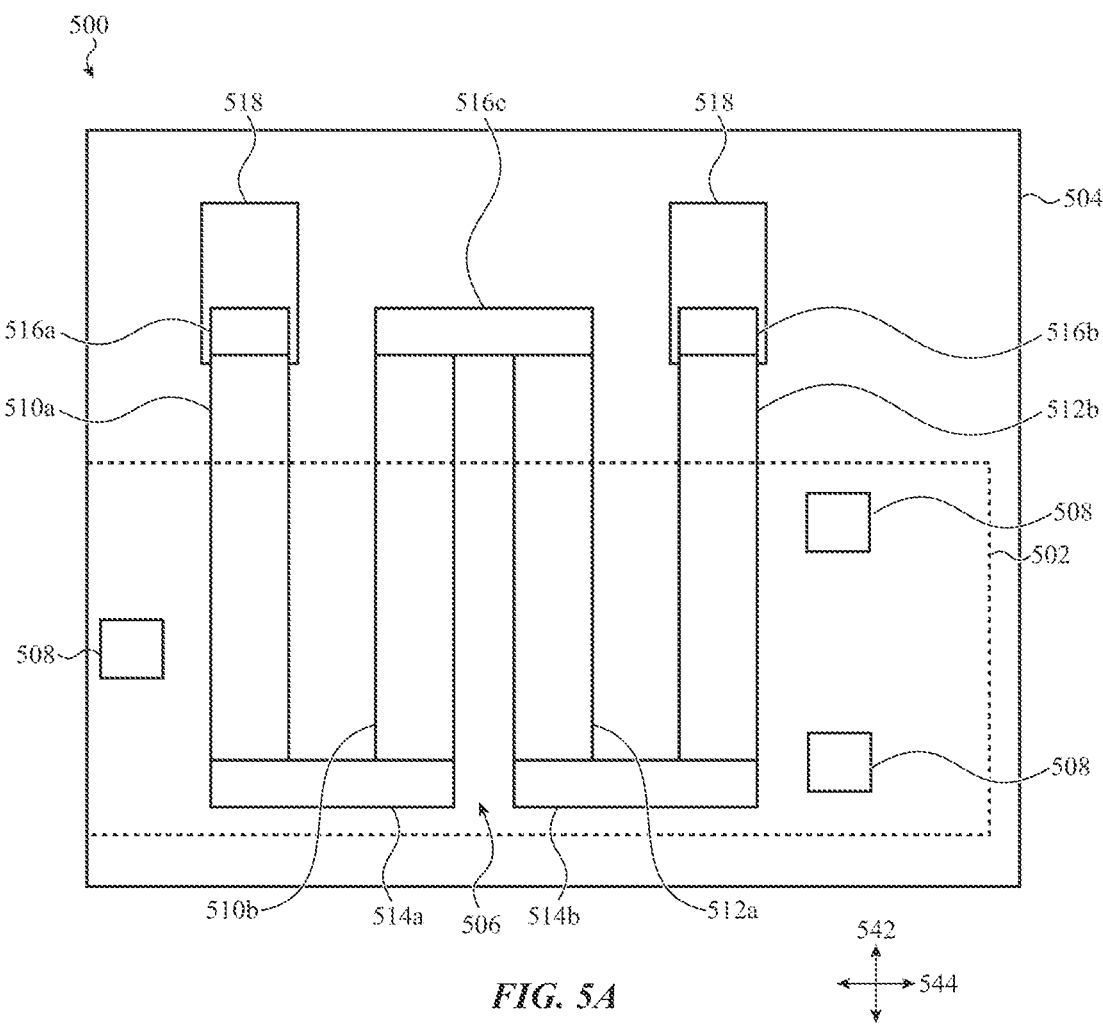
FIGS. 5A and 5B show top and side views, respectively, of another variation of a thermoelectric cooling module having a suspended semiconductor element.
Figure 5B:
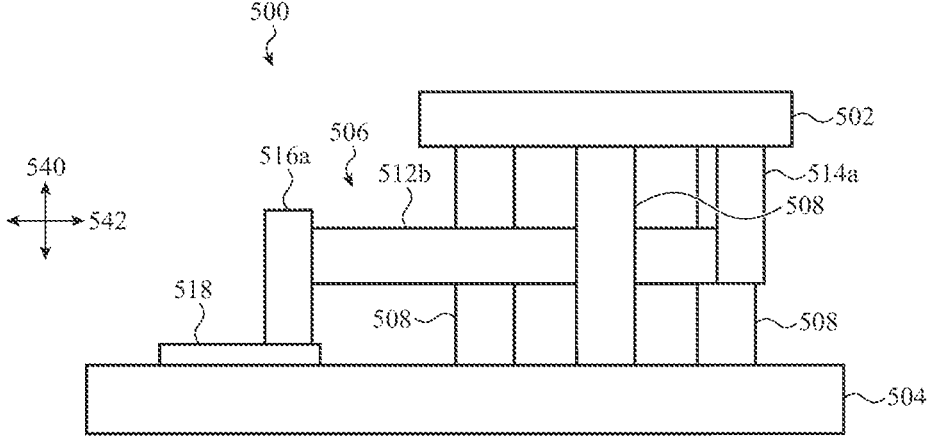

A power source (not shown) may be connected to the thermoelectric connector 506 via the electrical contacts 518 to drive current through the thermoelectric connector 506. When current is driven through the thermoelectric connector 506, current flows laterally through each of first and second pairs of semiconductor elements (e.g., along a first lateral direction 542 or a second lateral direction 544 that are orthogonal to the vertical stacking direction 540). In this way, heat will also flow laterally through the semiconductor elements as it is moved between the first substrate 502 and the second substrate 504. While two pairs of semiconductor elements are shown in FIGS. 5A and 5B, it should be appreciated that these teachings may be expanded to thermoelectric connectors having more than two pairs of semiconductor elements.

In some instances, such as depicted in FIGS. 2A-4, a thermoelectric connector as described here may be positioned entirely between the first substrate and the second substrate of a thermoelectric cooling module. In other instances, one or more portions of a thermoelectric connector may extend laterally beyond the periphery of either the first substrate or the second substrate. For example, in the variation of thermoelectric cooling module 500 shown in FIGS. and 5B, the first substrate 502 is narrower than the second substrate 504 along a first lateral direction 542, and a portion of the thermoelectric connector 506 (e.g., a portion of each semiconductor element and the first, second, and third lower connectors 516*a*, 516*b*, 516*c*) extends laterally beyond a side of the first substrate 502 such that the first substrate 502 is not positioned over this portion in the vertical stacking direction 540. By allowing a portion (or portions) of the first substrate 502, the thermoelectric connector 506 may increase in size and thereby improve the overall amount of heat that it can transfer between the first and second substrates 502, 504 without needing to increase the size of first substrate 502. Conversely, conventional thermoelectric cooling modules (such as thermoelectric cooling module 100 discussed previously) require that the each of the semiconductor elements is positioned between the first and second substrates.

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A thermoelectric cooling module comprising:

a first substrate;

a second substrate, wherein the first substrate is positioned above the second substrate in a vertical stacking direction;

a set of thermally-insulating support posts mechanically supporting the first substrate above the second substrate; and a thermoelectric connector connected to the first substrate and the second substrate and comprising a first terminal, a second terminal, and a plurality of semiconductor elements electrically coupled in series, wherein:

the plurality of semiconductor element comprises a first semiconductor element and a second semiconductor element;

the thermoelectric connector thermally couples the first substrate to the second substrate; and the thermoelectric connector is configured such that when a current is driven through the thermoelectric connector between the first terminal and the second terminal, heat flows laterally through at least a portion of each semiconductor element of the plurality of semiconductor elements in a corresponding lateral direction orthogonal to the vertical stacking direction;

the thermoelectric connector comprises an upper connector, a first lower connector and a second lower connector;

the first semiconductor element is positioned between the upper connector and the first lower connector along the lateral direction corresponding to the first semiconductor element; and the second semiconductor element is positioned between the upper connector and the second lower connector along the lateral direction corresponding to the second semiconductor element.

2. The thermoelectric cooling module of claim 1, wherein: one or more of the set of thermally-insulating support posts is configured to provide an electrical connection between the first substrate and the second substrate.

3. The thermoelectric cooling module of claim 1, wherein: the thermoelectric connector comprises a trace electrically isolating the upper connector from the first substrate, the trace from a from a thermally-conductive and electrically- insulating material.

4. A thermoelectric cooling module comprising:
a first substrate;
a second substrate, wherein the first substrate is suspended above the second substrate in a vertical stacking direction; and
a thermoelectric connector that thermally couples the first substrate to the second substrate and comprises a plurality of semiconductor elements electrically coupled in series, wherein:
each semiconductor element of the plurality of semiconductor elements comprises a corresponding suspended portion that is thermally separated from the first substrate by a first distance along the vertical stacking direction and is thermally separated from the second substrate by a second distance along the vertical stacking direction;
the plurality of semiconductor element comprises a first semiconductor element and a second semiconductor element;
the thermoelectric connector comprises an upper connector, a first lower connector and a second lower connector;
the first semiconductor element is positioned between the upper connector and the first lower connector along a lateral direction orthogonal to the vertical stacking direction; and
the second semiconductor element is positioned between the upper connector and the second lower connector along the lateral direction.

5. The thermoelectric cooling module of claim 4, wherein: the first substrate is separated from the second substrate by a first distance;
the corresponding suspended portion of each semiconductor element has a length in the lateral direction orthogonal; and
the length of each corresponding suspended portion is longer than the first distance.

6. The thermoelectric cooling module of claim 4, wherein: each corresponding suspended portion has:
a length along a first lateral direction orthogonal to the vertical stacking direction;
a width along a second lateral direction orthogonal to the first lateral direction and the vertical stacking direction; and
a height along the vertical stacking direction, wherein the length and the width are both longer than the height.

7. The thermoelectric cooling module of claim 4, wherein the thermoelectric connector is positioned entirely between the first substrate and the second substrate along the vertical stacking direction.

8. A thermoelectric cooling module comprising:
a first substrate;
a second substrate, wherein the first substrate is suspended above the second substrate in a vertical stacking direction; and
a thermoelectric connector that thermally couples the first substrate to the second substrate and comprising:
a first semiconductor element having a first conductivity type;
a second semiconductor element having a second conductivity type opposite the first conductivity type;
an upper connector that electrically connects the first semiconductor element to the second semiconductor element, and that thermally connects the first semiconductor element and the second semiconductor element to the first substrate;
a first lower connecter spaced laterally from the upper connector in a first lateral direction orthogonal to the vertical stacking direction, wherein the first lower connector thermally connects the first semiconductor element to the second substrate; and
a second lower connector spaced laterally from the upper connector in a second lateral direction orthogonal to the vertical stacking direction, wherein the first lower connector thermally connects the second semiconductor element to the second substrate, wherein:
the thermoelectric connector is configured such that a corresponding portion of each of the first semiconductor element and the second semiconductor element, the first lower connector, and the second lower connector extend laterally beyond a side of the first substrate.

9. The thermoelectric cooling module of claim 8, further comprising:
a power source electrically connected to the first lower connector and the second lower connector to drive current through the thermoelectric connector.

10. The thermoelectric cooling module of claim 9, wherein:
the power source is electrically connected to the first lower connector and the second lower connector via corresponding electrical traces positioned on the second substrate.

11. The thermoelectric cooling module of claim 8, wherein:
the first lateral direction is parallel to the second lateral direction.

12. The thermoelectric cooling module of claim 8 wherein:
a portion of the upper connector is positioned between a first portion of the first semiconductor element and the first substrate.

13. The thermoelectric cooling module of claim 12 wherein:
a portion of the first lower connector is positioned between a second portion of the first semiconductor element and the second substrate.

14. The thermoelectric cooling module of claim 8 wherein:

a portion of the first lower connector is positioned between a portion of the first semiconductor element and the second substrate.

* * * * *